US011016880B1

(12) United States Patent
Goss et al.

(10) Patent No.: US 11,016,880 B1
(45) Date of Patent: May 25, 2021

(54) DATA STORAGE SYSTEM WITH READ DISTURB CONTROL STRATEGY WHEREBY DISTURB CONDITION CAN BE PREDICTED (71) Applicant: Seagate Technology LLC, Fremont, CA (US)

(72) Inventors: Ryan James Goss, Prior Lake, MN (US); Daniel John Benjamin, Savage, MN (US); David W. Claude, Loveland, CO (US); Graham David Ferris, Savage, MN (US); Ryan Charles Weidemann, Victoria, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 15/929,358

(22) Filed: Apr. 28, 2020

(51) Int. Cl.
G06F 12/02 (2006.01)
G06F 12/0882 (2016.01)
G11C 16/34 (2006.01)
G06F 12/06 (2006.01)

(52) U.S. Cl.
CPC ...... *G06F 12/0246* (2013.01); *G06F 12/0253* (2013.01); *G06F 12/0653* (2013.01); *G06F 12/0882* (2013.01); *G11C 16/3418* (2013.01); *G06F 2212/263* (2013.01)

(58) Field of Classification Search
CPC ............. G06F 12/0253; G06F 12/0653; G06F 12/0882; G06F 12/0246; G11C 16/3418
See application file for complete search history.

(56) References Cited

U.S. PATENT DOCUMENTS

| 9,176,864 | B2 | 11/2015 | Gorobets et al. | |
| 9,183,134 | B2 | 11/2015 | Haines et al. | |
| 9,645,924 | B2 | 5/2017 | Fisher et al. | |
| 9,652,381 | B2* | 5/2017 | Higgins | G06F 12/0246 |
| 9,798,657 | B2* | 10/2017 | Moon | G06F 12/0246 |
| 10,176,212 | B1 | 1/2019 | Prohofsky | |
| 10,719,439 | B2* | 7/2020 | Goss | G06F 3/0659 |
| 2012/0005406 | A1* | 1/2012 | Hutchison | G06F 12/0246 |
| | | | | 711/103 |
| 2012/0317337 | A1 | 12/2012 | Johar et al. | |
| 2014/0052897 | A1 | 2/2014 | Goss et al. | |
| 2014/0136884 | A1 | 5/2014 | Werner et al. | |
| 2015/0032939 | A1* | 1/2015 | Gao | G06F 12/0246 |
| | | | | 711/103 |

* cited by examiner

*Primary Examiner* — Tammara R Peyton
(74) *Attorney, Agent, or Firm* — Hall Estill Attorneys at Law (57) ABSTRACT A system may consist of a network controller connected between a non-volatile memory and a host with a disturb module connected to the non-volatile memory. A received data write request from a host may prompt the assignment of a first physical block address in the non-volatile memory to a data block of the data write request with the network controller. The data block and first physical block address can each be characterized with the disturb module before the first physical block address is altered to a second block address in the non-volatile memory in response to a disturb strategy generated by the disturb module. The second block address can be selected based on the characterization of the data block and first physical block address with respect to a risk of a disturb condition occurring in the non-volatile memory.

20 Claims, 4 Drawing Sheets

DATA STORAGE SYSTEM WITH READ DISTURB CONTROL STRATEGY WHEREBY DISTURB CONDITION CAN BE PREDICTED

SUMMARY

In accordance with various embodiments, a data storage system has a non-volatile memory storing data blocks to a first garbage collection unit with the non-volatile memory connected to a disturb module that characterizes data and moves at least one data block to a second garbage collection unit in response to the data characterization and a disturb strategy generated by the disturb module.

A data storage system, in other embodiments, consists of a network controller connected between a non-volatile memory and a host with a disturb module connected to the non-volatile memory. A received a data write request from a host prompts the assignment of a first physical block address in the non-volatile memory to a data block of the data write request with the network controller. The data block and first physical block address are each characterized with the disturb module before the first physical block address is altered to a second block address in the non-volatile memory in response to a disturb strategy generated by the disturb module. The second block address is selected based on the characterization of the data block and first physical block address with respect to a risk of a disturb condition occurring in the non-volatile memory.

Some embodiments of a data storage system connect a network controller between a non-volatile memory and a host with a disturb module connected to the non-volatile memory. A received data write request from a host prompts the assignment of a first physical block address in the non-volatile memory to a data block of the data write request with the network controller where the first physical block address corresponds with a first garbage collection unit. The data block and first physical block address are each characterized with the disturb module before the first physical block address is altered to a second block address in the non-volatile memory in response to a disturb strategy generated by the disturb module. The second block address corresponds to a second garbage collection unit and is selected based on the characterization of the data block and first physical block address with respect to a risk of a disturb condition occurring in the non-volatile memory predicted by the disturb module.

DETAILED DESCRIPTION

Data storage devices have evolved to store more data and access that data faster than ever before. The advent of solid-state data storage devices have provided increasing data storage capabilities, but with operational challenges. For instance, frequent reads to a particular data set can disturb, or temporarily alter, the data stored on a data storage device. Such read disturb can affect the entire data set of a locality, such as an erasure block, which can jeopardize the performance of relatively large volumes of data. Hence, various embodiments are directed to reducing the data storage performance degradation of read disturb through intelligent handling of data access requests.

In a data storage system, particularly systems that employ distributed data storage to multiple different data storage devices, data can be logically and/or physically grouped to provide efficient data retrieval. The grouping of frequently accessed data can provide efficient data retrieval, but can be plagued by consequential read disturb occurrences that delay the accurate reading of data from the group. Accordingly, data can be dynamically grouped in response to detected and/or predicted data storage conditions to mitigate the occurrence, and duration, of read disturb phenomenon.

Figure 1:
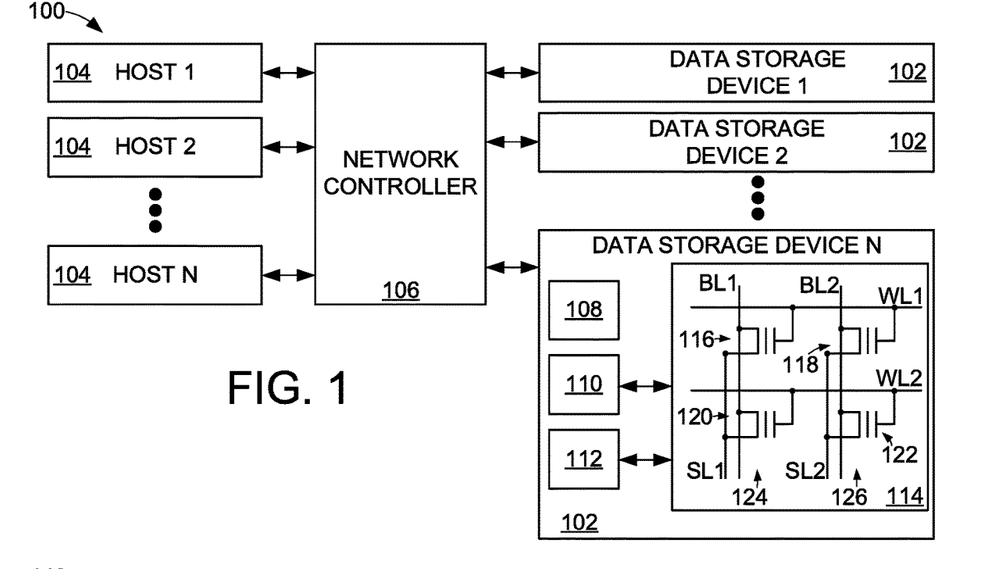
FIG. 1 displays a block representation of an example data storage system in which various embodiments may be practiced.

FIG. 1 displays an example data storage system 100 in which assorted embodiments of the present disclosure may be practiced. The system 100 can connect any number of data storage device 102 to any number of host 104 via a wired and/or wireless network. One or more network controller 106 can be hardware or software based and provide data request processing and distribution to the various connected data storage devices 102. It is noted that the multiple data storage devices 102 may be similar, or dissimilar, types of memory with different data capacities, operating parameters, and data access speeds.

In some embodiments, at least one data storage device 102 of the system 100 has a local processor 108, such as a microprocessor or programmable circuitry, connected to an on-chip buffer 110, such as static random access memory (SRAM), and an off-chip buffer 112, such as dynamic random access memory (DRAM), and a non-volatile memory array 114. The non-limiting embodiment of FIG. 1 arranges the non-volatile memory array 114 with NAND flash memory that is partially shown schematically with first (BL1) and second (BL2) bit lines operating in conjunction with first (WL1) and second (WL2) word lines along with first (SL1) and second (SL2) source lines to write and read data stored in first 116, second 118, third 120, and fourth 122 flash cells.

It is noted that the respective bit lines correspond with first 124 and second 126 pages of memory that are the minimum resolution of the memory array 114. That is, the construction of the flash memory prevents the flash cells from being individually rewritable in-place and instead are rewritable on a page-by-page basis. Such low data resolution, along with the fact that flash memory wears out after a number of write/rewrite cycles, corresponds with numerous performance bottlenecks and operational inefficiencies compared to memory with cells that are bit addressable while being individually accessible and individually rewritable in-place. Hence, various embodiments are directed to implementing bit addressable, rewritable in-place memory into a data storage device 102 that may be part of a distributed network data storage system 100.

Figure 2A:
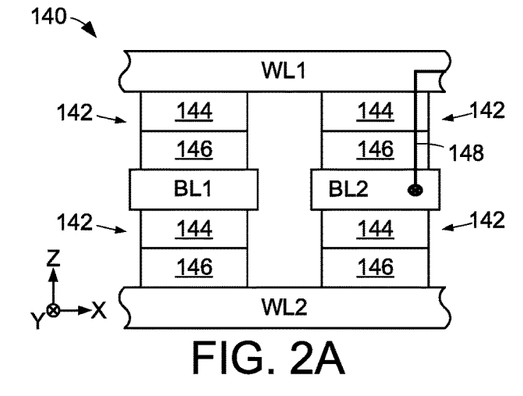
FIGS. 2A & 2B respectively represent portions of an example data storage device that may be employed in the data storage system of FIG. 1.
Figure 2B:
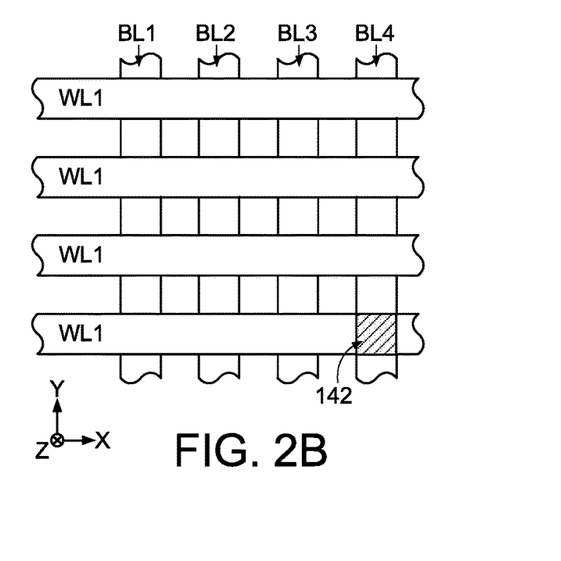

FIGS. 2A and 2B represent portions of an example memory array 140 that may be utilized in a data storage device in accordance with various embodiments. The memory array 140 has a plurality of separate memory cells 142 vertically stacked along the Z axis as part of a three dimensional array. While it is contemplated that a single die of memory cells 142 can be utilized, such configuration has diminished data capacity and fails to utilize the all the available space. Hence, various embodiments vertically stack multiple die of memory cells 142 that each reside in the X-Y plane. In yet, the vertically stacked cells 142 are not, necessarily, required to be vertically aligned in the manner shown in FIG. 2A.

With NAND flash memory and other solid-state data storage cells, a transistor or other separate selection component is incorporated into each cell, which occupies valuable real estate, consumes extra power, and adds latency to data access operations. Each memory cell 142 of the memory array 140 is constructed without a transistor or other physically separate selection component and instead has a selection layer 144 contacting a resistive unit 146. The selection layer 144 can be a single material or a lamination of different materials that prevent electrical flow to the resistive unit 146 at predetermined times and allows electrical flow to the resistive unit 146 at other predetermined times. As a non-limiting example, the selection layer 144 can be a metal-insulator transition (MIT) material, an ovonic threshold switch (OTS), or other voltage regulating structure.

The inclusion of a transistor or other selection component, as shown in FIG. 1, corresponds with a source line that activates the respective selection component. The elimination of any selection components in favor of the selection layer 144 allows the vertically stacked memory cells 142 to be individually accessible by a cross-point interconnect configuration where bit lines (BL) operate with word lines (WL) to access one or more cells 142. However, it is noted that a source line may be utilized by a vertically stacked die of memory cells 142 with, or without, the selection layer 144 or a transistor.

As illustrated by line 148, an induced electrical potential difference between the bit line and word line induces electrical flow through a single memory cell 142. The ability to select a single bit, hence bit addressable, allows the memory array 140 to densely package the cells without concern for inadvertent accessing of memory cells 142. Such bit addressable construction is not required and some embodiments utilize memory configurations that are page addressable as a smallest accessible resolution, which corresponds with a plurality of memory cells 142 connected to a bit line, or word line, having electrical flow concurrently.

It is noted that the construction of the memory cells 142 provides for relatively low power consumption. The top view of FIG. 2B conveys how the memory cells 142 can be positioned with respect to assorted bit and word lines alone a single die. By utilizing bit lines between vertically stacked memory cells 142, the overall number of control interconnects can be reduced, which provides a more densely packaged memory array 140. In yet, the more densely memory cells 142 are packaged, risk, severity, and duration of disturb phenomenon in non-selected and physically adjacent cells 142 during read and/or write operations increases. While some types of solid-state memory, such as phase change, spin-torque, and filament-based cell constructions, may be more, or less, susceptible to disturb effects resulting from data access operations in the form of data reads or data writes, the miniaturization of the physical construction of a memory array 140 and emphasis on fast data access satisfaction, particularly for data reads, produces ample read disturb occurrences to degrade data storage performance for a system over time.

Figure 3A:
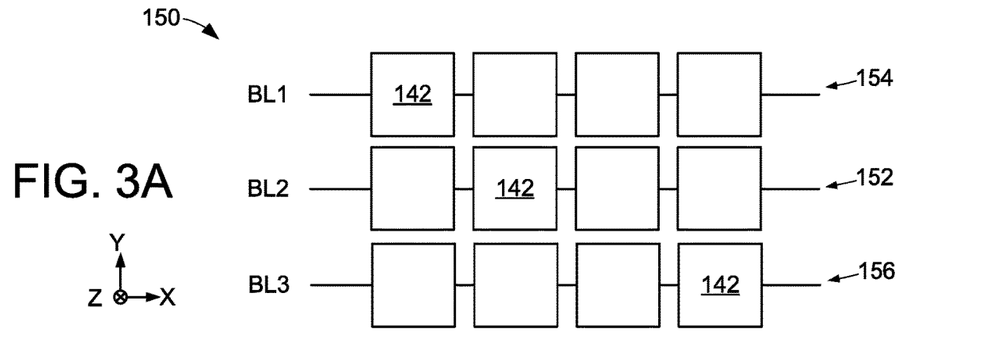
FIGS. 3A & 3B respectively depict aspects of an example data storage device operated in accordance with assorted embodiments.

FIG. 3A depicts a block representation of portions of an example data storage device 150 that employs solid-state memory cells 142 accessed with circuitry more broadly illustrated in FIGS. 2A and 2B. Activation of a first bit line 152 to conduct data access operations, such as a data read, data write, or cell refresh, can cause the memory cells 142 of physically adjacent bit lines 154/156 to be disturbed. It is noted that such disturbed condition can be variable for different cells 142 despite having the same physical proximity to the activated bit line 152. The disturbed condition may also extend to vertically adjacent memory cells aligned with, or offset from, the activated bit line 152 along the Z axis. It is contemplated that a disturbed condition can be experienced during data read operations in memory arrays that have a page of cells 142 as a minimum resolution, although bit addressable memory arrays can also experience disturb conditions.

Figure 3B:
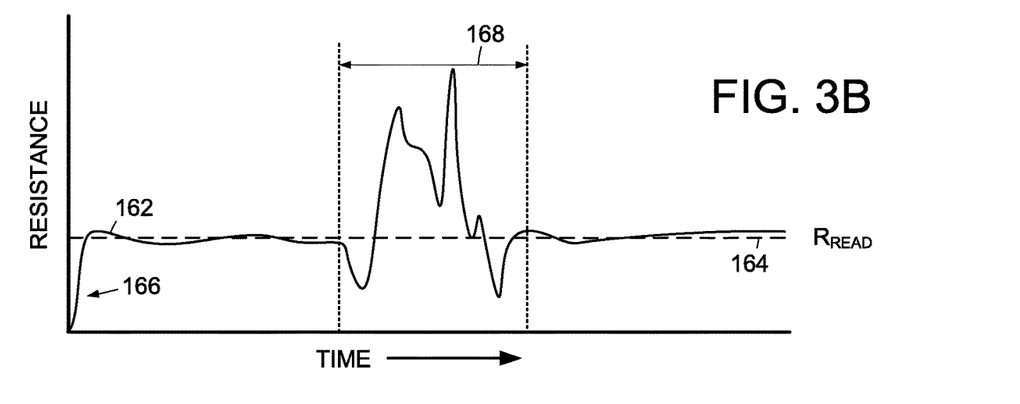

FIG. 3B plots example operational data of memory cell resistance over time associated with a read disturb condition. Solid line 162 conveys how a memory cell 142 can be set to a particular resistance 164 by a data access write operation 166 that can be reliably read by a data read operation where the cell is activated by a read voltage until a read disturb occurrence 168 is experienced. While not required or limiting, a read disturb condition 168 can cause the resistance of the memory cell 142 to fluctuate over time, as shown. It is noted that the actual programmed resistance of the memory cell 142 may not change during the read disturb condition 168, but the resistance of the cell 142 during a read operation during the read disturb condition 168 may be different than the programmed state 164 before returning to that programmed resistance 164 at the conclusion of the read disturb condition 168.

Figure 4:
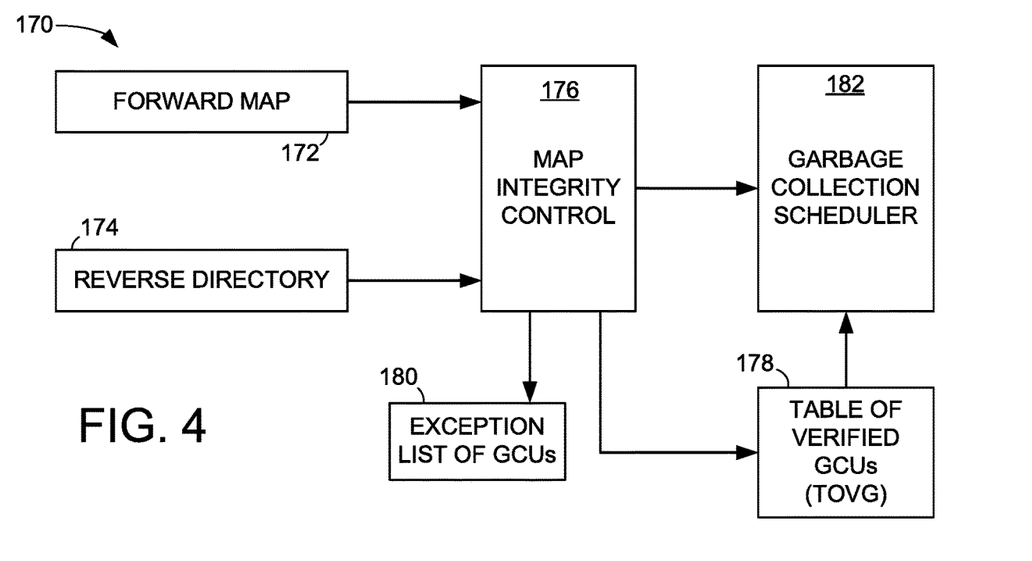
FIG. 4 depicts a block representation of portions of a data storage system configured in accordance with some embodiments.

FIG. 4 shows a functional block diagram for a data storage device management circuit 170 that can be utilized in accordance with some embodiments of a data storage device. The circuit 170 may form a portion of a data storage device, or network, controller 106 and may be realized using hardware circuitry and/or one or more programmable processor circuits with associated firmware in memory. The circuit 170 employs a forward map 172 and a reverse directory 174 that are respectively metadata data structures that describe the locations of the data blocks in solid-state memory arrays 140/150. During the servicing of host data transfer operations, as well as other operations, the respective portions of these data structures are located in the solid-state memory arrays, or other non-volatile memory locations, until being copied to local memory.

The forward map 172 provides a flash transition layer (FTL) to generally provide a correlation between the logical addresses of various blocks and the physical addresses at which the various blocks are stored (e.g., die set, die, plane, garbage collection unit (GCU), EB, page, bit offset, etc.). The contents of the forward map 172 may be stored in specially configured and designated GCUs in each die set. The reverse directory 174 provides a physical address to logical address correlation. The reverse directory 174 contents may be written as part of the data writing process to each GCU, such as in the form of a header or footer along with the data being written. Generally, the reverse directory

174 provides an updated indication of how many of the data blocks (e.g., MUAs) are valid (e.g., represent the most current version of the associated data).

The circuit 170 further employs a map integrity control circuit 176 that generally operates at selected times to recall and compare, for a given GCU, the forward map data and the reverse directory data. This evaluation step includes processing to determine if both metadata structures indicate the same number and identify of the valid data blocks in the GCU. If the respective forward map and reverse directory match, the GCU is added to a list of verified GCUs in a data structure referred to as a table of verified GCUs, or TOVG 208. The table can take any suitable form and can include a number of entries, with one entry for each GCU. Each entry can list the GCU as well as other suitable and useful information, such as but not limited to a time stamp at which the evaluation took place, the total number of valid data blocks that were determined to be present at the time of validation, a listing of the actual valid blocks, etc.

Should the control circuit 176 find a mismatch between the forward map 172 and the reverse directory 174 for a given GCU, the control circuit 206 can further operate to perform a detailed evaluation to correct the mismatch. For example, if the forward map 172 indicates that there should be some number X valid blocks in the selected GCU, such as 12 valid blocks, but the reverse directory 174 indicates that there are only Y valid blocks, such as 11 valid blocks, and the 11 valid blocks indicated by the reverse directory 174 are indicated as valid by the forward map, then the focus can be upon the remaining one block that is valid according to the forward map but invalid according to the reverse directory.

Mismatches can arise due to a variety of factors such as incomplete writes, unexpected power surges or disruptions that prevent a full writing of the state of the system, etc. Regardless, the control circuit can expend the resources as available to proactively update the metadata. In some embodiments, an exception list 180 may be formed as a data structure in memory of GCUs that have been found to require further evaluation. In this way, the GCUs can be evaluated later at an appropriate time for resolution, after which the corrected GCUs can be placed on the verified list in the table of verified GCUs (TOVG) 178.

It will be noted that the foregoing operation of the control circuit 176 in evaluating GCUs does not take place once a garbage collection operation has been scheduled; instead, this is a proactive operation that is carried out prior to the scheduling of a garbage collection operation. In some cases, GCUs that are approaching the time at which a garbage collection operation may be suitable, such as after the GCU has been filled with data and/or has reached a certain aging limit, etc., may be selected for evaluation on the basis that it can be expected that a garbage collection operation may be necessary in the relatively near future.

FIG. 4 further shows the management circuit 170 having a garbage collection scheduler circuit 182. This circuit 182 generally operates once it is appropriate to consider performing a garbage collection operation, at which point the circuit 182 selects from among the available verified GCUs from the table 178. In some cases, the circuit 182 may generate a time of completion estimate to complete the garbage collection operation based on the size of the GCU, the amount of data to be relocated, etc.

As will be appreciated, a garbage collection operation can include accessing the forward map and/or reverse directory 172, 174 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

In some embodiments, GCUs can be configured into die sets across memory of a solid-state data storage device. Each die set may have the same nominal data storage capacity (e.g., the same number of allocated dies, etc.), or each may have a different storage capacity. In addition, a separate TOVG (table of verified GCUs) 178 may be maintained by and in each die set to show the status of the respective GCUs. From this, each time that it becomes desirable to schedule a garbage collection operation, such as to free up new available memory for a given set, the TOVG 178 can be consulted to select a GCU that, with a high degree of probability, can be subjected to an efficient garbage collection operation without any unexpected delays due to mismatches in the metadata (forward map and reverse directory). However, the presence of read disturb conditions can slow the execution of a garbage collection operation as the resistance of memory cell(s) is temporarily inaccurate.

With these issues in mind, various embodiments evaluate current, queued, and predicted data access operations to determine where memory cells can experience a disturbed condition to dynamically maneuver where data is stored and/or how data is read to mitigate the risk, and severity, of cell disturb conditions. The creation and execution of a disturb strategy allows for efficient activation of proactive and/or reactive actions prescribed by the strategy to alter the risk, scope, and duration of at least disturb conditions during data read operations. The ability to dynamically conduct data storage, and retrieval, to mitigate disturb conditions allows for consistent and lower averages for overall data storage performance.

Figure 5:
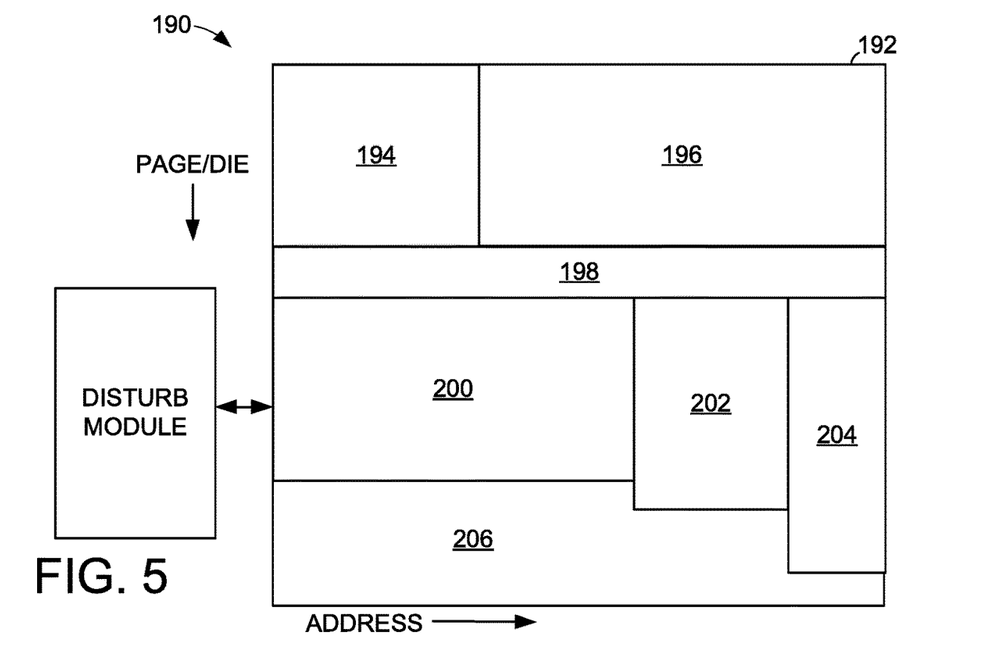
FIG. 5 depicts a block representation of portions of an example data storage system arranged in accordance with various embodiments.

FIG. 5 depicts a block representation of portions of an example distributed data storage system 190 in which assorted embodiments can be practiced. The distributed data storage system 190 can consist of any number of data storage devices that individually, or collectively, provide a data repository 192 that is visually represented as a box with increasing physical data block addresses towards the right and increasing page, and/or die, locations towards the bottom. As directed by a disturb module and the respective local controllers for each constituent data storage device providing memory for the repository 192, assorted GCUs are created by assigning certain physical block addresses (PBA) where logical block addresses (LBA) are stored for concurrent background operations, which may consist of garbage collection activity alone or in combination with data reconstruction, refreshing, mapping, or read/write voltage calibration.

It is noted that a GCU is a logical construct that does not, necessarily, correlate with the physical location of data. That is, the LBA of a GCU can be in different planes, die, and pages of one or more data storage devices. However, the representation of the repository 192 in FIG. 5 corresponds with LBA assigned to GCUs in correlation with the physical location associated with the LBA. In yet, GCU can consist of physical data locations in multiple different planes, die, and pages, as conveyed by the increasing page/die count towards the bottom of the repository 192.

It is contemplated that GCUs can be initially created and remain static over time so that the same LBA and physical locations are consistent. Such a configuration can be particularly useful in repositories utilizing rotating magnetic media for data storage. However, the use of solid-state memories that experience disturb conditions depending on the physical proximity to an activated and/or accessed page, block, die, plane, or array can result in static GCU assignments becoming inefficient over time as memory cells become faulty or data is arranged so that LBA are accessed much more, or less, frequently. Hence, various embodiments dynamically adapt the size and/or location of GCU in a repository 192 with the disturb module in response to detected, and predicted, data storage and memory conditions. The ability to customize GCU configurations in response to data access activity and data storage status allows for a consistently optimized data storage performance, particularly with regard to data accesses degraded by the effects of disturb conditions.

As non-limiting examples of GCU customization, a first GCU 194 may consist of multiple pages/die while occupying less than all of the available physical addresses on each utilized page/die. The first GCU 194 can be modified by the disturb module to the second GCU 196 where the same pages/die are utilized, but different PBAs of each page/die are used from the first GCU 194. It is contemplated that the entirety of PBAs in a page/die can be assigned for a GCU, as illustrated by a third GCU 198. All the PBAs of one or more page/die can be concurrently assigned to more than one GCU, as illustrated by the fourth 200, fifth 202, and sixth 204 GCUs. Meanwhile, some portions of the repository 192 may be unassigned, expired, or otherwise reserved, as shown by region 206.

Figure 6:
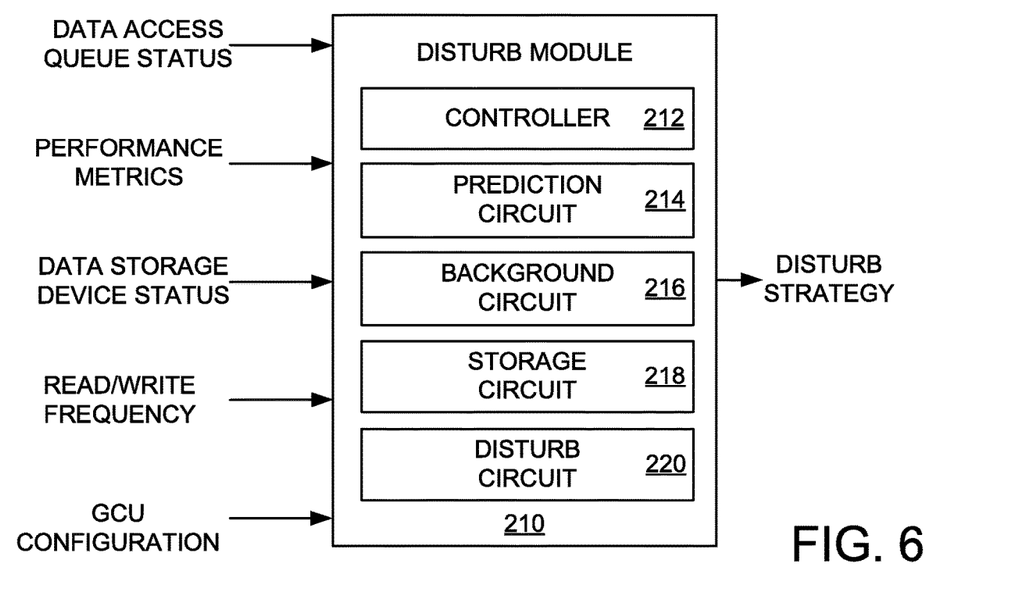
FIG. 6 depicts an example disrupt module that can be utilized in a data storage system in some embodiments.

A block representation of an example disturb module 210 is displayed in FIG. 6. It is noted that the module 210 can be realized in hardware and software of a component of a distributed data storage system or as a stand-alone component connected to at least one data storage device and network controller. The disturb module 210 can employ a module controller 212, which may be a microprocessor or other programmable circuitry, to evaluate multiple inputs to generate at least one disturb strategy that prescribes actions to prevent, or at least mitigate the severity of, the occurrence of a disturb condition. It is noted that the severity of a disturb condition may be measured in duration, number of memory cells disturbed, or relative deviation from a programmed cell resistance reading.

While not required or limiting, the disturb module controller 212 can poll, sense, detect, and query a plurality of different types of information, such as queued data access volume and status, current data storage performance for one or more data storage devices, status of at least one data storage device, current GCU configurations, logged data write frequency, and logged data read frequency. A prediction circuit 214 can transform one or more current and/or pending data storage condition and/or activity to forecast at least one future condition or activity. For instance, the prediction circuit 214 can predict the location and severity of disturb conditions for queued data access requests or can predict the read and/or write frequency for various physical block addresses in response to current read/write frequency along with GCU configuration and predicted data access requests.

A background circuit 216 can provide the module controller 212 with an accurate understanding of the schedule and operation of assorted background operations for various data storage devices and GCUs of a system. That is, the background circuit 216 can process one or more inputted information to identify what background operations have been performed, what background operations are scheduled, and when background operations are triggered. Although not limiting, background operations identified by the background circuit 216 can involve garbage collection, data reconstruction, data mapping, memory cell refreshing, and memory cell voltage calibrations. The understanding of current and future background operation activity for individual data storage devices as well as the collective memory of the system allows the prediction circuit 214 and controller 212 to optimize the disturb strategy to account for background activity that contributes to the occurrence and severity of disturb conditions.

A storage circuit 218 can provide the module controller 212 with information pertaining to what type of data are stored in the respective GCUs of a system. The storage circuit 218 may, in some embodiments, characterize incoming data and/or current stored data locations on a spectrum of less frequently accessed to more frequently accessed. Such characterization can involve logged activity, model data, and activity predicted to occur. The storage circuit 218 can generate a map of each GCU that correlates physical memory cell locations with frequency of host-initiated data accesses, background operation data accesses, and error-initiated accesses. The generated map can allow the module controller 212 to identify weaknesses to disturb conditions.

The current, future, and predicted susceptibilities to the occurrence of disturb conditions can be processed by a disturb circuit 220 to determine proactive and/or reactive actions that can mitigate or prevent those conditions with the disturb strategy. The disturb circuit 220 can prescribe the alteration of the size and/or location of GCUs, changing what background operations are executed, when background operations are executed, and the ratio of different types of data in a GCU. For instance, the disturb strategy can specify a ratio of less frequently accessed data locations to more frequently accessed data locations for a GCU that dynamically adapts to the data access frequency of the GCU to prevent/mitigate disturb conditions. The disturb circuit 220 can prescribe the moving of data to different PBA while maintaining the same LBA to ensure a predetermined physical distance, such as at least one bit, word, or source line separating cells, a µm, or an empty memory cell, between frequently accessed portions of a GCU and infrequently accessed portions.

The ability to construct the disturb strategy with proactive and reactive actions allows for the mitigation/prevention of disturb conditions over time. It is contemplated that the disturb strategy can be configured to conduct a number of proactive actions to reduce the occurrence of disturb conditions at certain times, such as during deterministic windows where a read latency is guaranteed to a host. By executing proactive actions to reduce disturb conditions for particular times, such as high volume data read times, it is contemplated that disturb conditions may occur more frequently at other times, such as high volume data write times. The prediction of future data storage status and data accesses allows for an optimized balance of system configuration, such as GCU arrangement, data arrangement, and background operation execution, to provide prescribed times of higher disturb occurrences and lower disturb occurrences.

Figure 7:
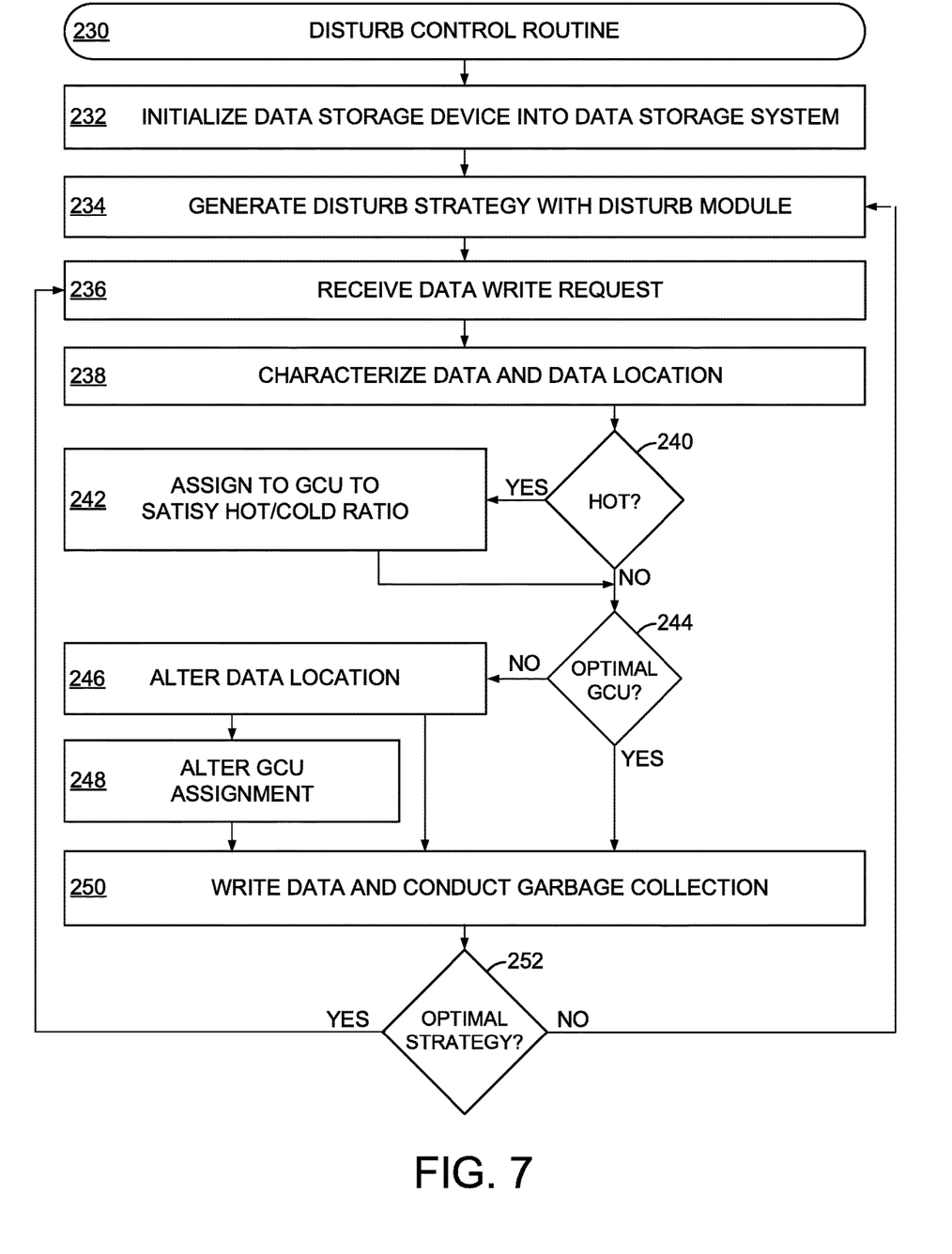
FIG. 7 is a flowchart of an example disturb control routine that can be carried out with the assorted embodiments of FIGS. 1-6.

The disturb strategy can be continuously or sporadically executed. It is contemplated that multiple different strategies are generated and executed concurrently or individually. FIG. 7 depicts an example disturb control routine 230 that can be carried out by the assorted embodiments of FIGS. 1-6 to provide optimized data storage performance by controlling the occurrence and/or severity of disturb conditions. The routine 230 begins with the initialization of at least one data storage device into a data storage system in step 232. Such initialization may involve the physical connection of a device and/or the electrical connection with at least an upstream network controller and a disturb module. Step 232 can utilize one or more protocol to bring the device into compliance with system security, encryption, and data mapping to allow data accesses to/from the device.

A disturb strategy is then generated in step 234 by the connected disturb module. The strategy can be created, or modified, in response to the detected, predicted, or tested performance and capabilities of the newly initialized device(s). That is, the disturb module can monitor data accesses, forecast data storage characteristics based on the initialization procedure, or execute one or more data access test patterns to the newly initialized device(s) to determine how data will be stored and the provided capabilities for the system. The resultant disturb strategy may be specific to a single data storage device or may apply to multiple interconnected devices of the data storage system.

As a non-limiting example of a disturb strategy generated in step 234, proactive actions, such as characterizing incoming data as hot (frequently accessed) or cold (infrequently accessed) along with characterizing PBA of a data storage device as hot or cold, can be conducted along with triggers, such as entering a deterministic window or a relatively high volume of queued data reads, or writes, that correspond with reactive actions, such as moving data to different PBA, altering GCU size/location, or adjusting background operation scheduling. A disturb strategy, in other embodiments, prescribes different ratio of hot and cold data for different GCU based on the current and/or predicted future operation of the respective GCU with respect to disturb conditions, which can be adjusted over time as the GCUs are altered, the PBA of a GCU become hotter or colder, and the manner of disturb mitigation/prevention changes, such as increasing the physical distance between memory cells storing hot data or the number of cold data stored in physical proximity to hot data.

With the established disturb strategy, step 236 proceeds to receive at least one data access request, which may be a data write, data read, or data move initiated by an upstream host, such as a user or network controller. In the event of a data write request, the incoming data is characterized by the disturb module in step 238 as frequently accessed (hot) or infrequently accessed (cold). Step 238 may also characterize one or more PBAs on a spectrum of hotness to coldness in response to a data read, write, or move request. Such characterizations allow the disturb module, and executing network/device controllers, to carry out the disturb strategy to locate the incoming data, for a write request, or perhaps move existing data, for a read request, based on the detected and/or predicted frequency of accesses for that data and a corresponding PBA.

Decision 240 may be part of a disturb strategy and can determine if the data, or corresponding PBA, of a data access request has a detected/predicted hotness above a threshold value set by the disturb strategy to be hot, such as a number of accesses a second when background operations are factored in. If data and/or a PBA is determined as hot in decision 240, step 242 assigns the incoming, or existing data, to a different GCU to satisfy a hot/cold ratio set by the disturb strategy. In other words, if incoming data is hot, or if existing data becomes hot, the existing ratio, or physical location, of data in a GCU may become inconsistent with the hot/cold ratio for the GCU prescribed by the disturb strategy and data is subsequently moved in step 242 to maintain the prescribed hot/cold ratio for each GCU. It is noted that step 242 may perform a data move or data programming in a delayed fashion from the time decision 240 determines a hot/cold ratio is incorrect to allow for system performance to be smooth and equalized over time.

At the conclusion of equalization of the hot/cold ratio for at least one GCU, or if an existing ratio is consistent after satisfying the request of step 236, decision 244 determines if one or more GCUs are optimized for future performance against disturb conditions. That is, decision 244 evaluates the current and predicted operation and performance of GCUs in accordance with a disturb strategy, other than hot/cold ratios, to determine if proactive actions can be conducted to reduce the risk of disturb conditions. For instance, decision 244 may determine previously cold memory cells/pages will become hot over time and position frequently read PBAs in too close of proximity according to the disturb strategy. Alternatively, decision 244 may determine error-prone memory cells will alter future memory cell accesses for a GCU that prompts the deconstruction of the GCU according to the disturb strategy.

A sub-optimal GCU configuration from decision 244 prompts step 246 to alter the PBA of at least one data block. Such data movement may be within a single GCU or reposition data to a different GCU of the system. The relocation of data in step 246 may be combined with the alteration of GCU assignment for one or more data sets in step 248. It is contemplated that step 248 may completely reconstruct a GCU by reassigning all the current data of the GCU to other GCUs of the system, which may include a newly created GCU having a size and PBA ranges in accordance with the disturb strategy.

If a GCU is considered optimal for current and predicted data storage conditions in decision 244, or if a GCU is altered to provide an optimal configuration, step 250 conducts at least one background operation on one or more GCU. The background operation(s) of step 250 can be conducted over time and are executed as directed by the disturb strategy so that the risk of disturb conditions is not heightened. At any time after step 250, decision 252 can evaluate if the current disturb strategy is optimal. Decision 252 may evaluate numerous strategy performance metrics, such as disturb condition occurrence, average data read latency, data read errors, and pending data access queue to determine if the strategy can be improved. If so, step 234 is revisited either to replace the entirety of a disturb strategy or alter at least one aspect of a disturb strategy in an effort to at least decrease the frequency or severity of disturb conditions. If the present disturb strategy is optimal, new data access requests are received and serviced by returning to step 236.

Through the various embodiments of the present disclosure, the occurrence and severity of disturb conditions on solid-state data storage memories can be reduced through the intelligent generation and execution of a disturb strategy. The ability to dynamically adapt to changing data accesses by changing data locations and/or GCU configurations allows a data storage system to enjoy consistent resiliency to disturb conditions that jeopardize the performance of one or more data storage devices. With the ability to conduct proactive and reactive actions in accordance with a disturb strategy, particular times, such as high volume data read windows, can experience reduced disturb conditions that optimize data throughput for one or more hosts.

What is claimed is:

1. An apparatus comprising a non-volatile memory storing data blocks to a first garbage collection unit, the non-volatile memory connected to a disturb module to characterize data and move at least one data block to a second garbage collection unit in response to the data characterization and a disturb strategy generated by the disturb module, the data characterization corresponding to a risk of a disturb condition predicted to occur in the non-volatile memory by the disturb module.

2. The apparatus of claim 1, wherein the non-volatile memory is an array of solid-state memory cells.

3. The apparatus of claim 1, wherein the disturb module comprises a controller resident in a data storage device housing the non-volatile memory.

4. The apparatus of claim 1, wherein the disturb module comprises a controller connected to a network controller positioned upstream of the non-volatile memory.

5. The apparatus of claim 1, wherein the non-volatile memory has a minimum data access resolution of a page.

6. A method comprising:
 connecting a network controller between a non-volatile memory and a host, a disturb module connected to the non-volatile memory;
 receiving a data write request from a host;
 assigning a first physical block address in the non-volatile memory to a data block of the data write request with the network controller;
 characterizing the data block and first physical block address with the disturb module;
 altering the first physical block address to a second block address in the non-volatile memory in the non-volatile memory in response to a disturb strategy generated by the disturb module, the second block address selected based on the characterization of the data block and first physical block address with respect to a risk of a disturb condition occurring in the non-volatile memory predicted by the disturb module.

7. The method of claim 6, wherein the second physical block address is selected to provide a ratio of frequently and infrequently accessed data blocks in the non-volatile memory, the ratio set by the disturb strategy.

8. The method of claim 6, wherein the data block is characterized by the disturb module on a spectrum of a plurality of different levels of access frequency.

9. The method of claim 7, wherein the data block is characterized by a prediction circuit and a storage circuit of the disturb module based on predicted and detected data storage activity in the non-volatile memory.

10. The method of claim 6, wherein the second physical block address is selected to provide a physical distance between data blocks characterized as frequently accessed, the physical distance set by the disturb strategy.

11. The method of claim 10, wherein the physical distance is set as at least one data block characterized as infrequently accessed positioned adjacent to each data block characterized as frequently accessed.

12. The method of claim 6, wherein the disturb strategy prescribes at least one proactive action to reduce a severity of a disturb condition in the non-volatile memory.

13. The method of claim 6, wherein the disturb strategy prescribes at least one reactive action to reduce a severity of a disturb condition in the non-volatile memory, the at least one reactive action triggered by a threshold being met, the threshold set by the disturb strategy.

14. A method comprising:
 connecting a network controller between a non-volatile memory and a host, a disturb module connected to the non-volatile memory;
 receiving a data write request from a host;
 assigning a first physical block address in the non-volatile memory to a data block of the data write request with the network controller, the first physical block address corresponding with a first logical garbage collection unit;
 characterizing the data block and first physical block address with the disturb module;
 altering the first physical block address to a second block address in the non-volatile memory in response to a disturb strategy generated by the disturb module, the second block address corresponding to a second garbage collection unit and selected based on the characterization of the data block and first physical block address with respect to a risk of a disturb condition occurring in the non-volatile memory predicted by the disturb module.

15. The method of claim 14, wherein a size of the first garbage collection unit is altered in accordance with the disturb strategy in response to the characterization of the first physical block address.

16. The method of claim 14, wherein the disturb strategy is altered in response to the disturb strategy determining the strategy was sub-optimal to prevent disturb conditions from occurring.

17. The method of claim 14, wherein the disturb strategy is generated by the disturb module in response to a predicted location of a disturb condition in the non-volatile memory.

18. The method of claim 14, wherein the disturb strategy alters a schedule of background operations to the respective first and second garbage collection units to reduce a risk of a disturb condition occurring.

19. The method of claim 14, wherein the alteration of the first physical block address to the second physical block address decreases a risk of a disturb condition during a future high volume of data read requests predicted by the disturb module.

20. The method of claim 19, wherein the alteration of the first physical block address to the second physical block address increases a risk of a disturb condition during a future volume of data write requests predicted by the disturb module.

* * * * *